US010784298B2

(12) United States Patent
Dong et al.

(10) Patent No.: US 10,784,298 B2
(45) Date of Patent: Sep. 22, 2020

(54) OPTICAL MODULE, FABRICATION METHOD THEREOF, AND TERMINAL DEVICE USING THE SAME

(71) Applicant: SHENZHEN GOODIX TECHNOLOGY CO., LTD., Shenzhen (CN)

(72) Inventors: Haoxiang Dong, Shenzhen (CN); Ya Wei, Shenzhen (CN); Wei Long, Shenzhen (CN); Baoquan Wu, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/432,913

(22) Filed: Jun. 5, 2019

(65) Prior Publication Data

US 2019/0326339 A1 Oct. 24, 2019

Related U.S. Application Data

(63) Continuation of application No. PCT/CN2017/118638, filed on Dec. 26, 2017.

(30) Foreign Application Priority Data

Nov. 9, 2017 (CN) .................... 2017 2 1489594 U

(51) Int. Cl.
*H01L 27/146* (2006.01)
*G06K 9/00* (2006.01)

(52) U.S. Cl.
CPC .... *H01L 27/14618* (2013.01); *G06K 9/00013* (2013.01); *H01L 27/14627* (2013.01); *H01L 27/14636* (2013.01); *H01L 27/14683* (2013.01)

(58) Field of Classification Search
CPC ......... H01L 27/14618; H01L 27/14627; H01L 27/14636; H01L 27/14683; G06K 9/00013
(Continued)

(56) References Cited

U.S. PATENT DOCUMENTS 5,962,842 A * 10/1999 Kimura ............. H01L 31/02005
250/208.1
2006/0138579 A1* 6/2006 Shin .................. H01L 27/14618
257/433
(Continued)

FOREIGN PATENT DOCUMENTS

DE 102008007237 A1 8/2008
EP 2190025 A1 5/2010
(Continued)

*Primary Examiner* — Tong-Ho Kim

(57) ABSTRACT

Embodiments of the present application, pertaining to the technical field of optical devices, provide an optical module and a fabrication method thereof, and a terminal device using the same. The optical module includes a lens and a sensor package. The lens is positioned at an uppermost position of the optical module and attached to a lower position of a terminal screen, and is configured to transmit light passing through the screen; the sensor package includes an optical sensor, where a photosensitive region is arranged on an upper surface of the optical sensor, and the photosensitive region is configured to receive light passing through the lens; and the sensor package further includes an air gap, and the photosensitive region of the optical sensor is configured to receive the light passing through the screen via the air gap.

7 Claims, 6 Drawing Sheets

(58) Field of Classification Search
USPC .......................................................... 257/432
See application file for complete search history.

(56) References Cited

U.S. PATENT DOCUMENTS

| | | |
|---|---|---|
| 2006/0268144 A1 | 11/2006 | Tan et al. |
| 2007/0108561 A1* | 5/2007 | Webster ............ H01L 27/14618 257/666 |
| 2007/0267712 A1* | 11/2007 | Fujita ................ H01L 27/14618 257/443 |
| 2008/0197435 A1* | 8/2008 | Yang ................. H01L 27/14618 257/432 |
| 2010/0079642 A1 | 4/2010 | Kurimoto et al. |
| 2011/0024862 A1* | 2/2011 | Tu ..................... H01L 27/14618 257/434 |
| 2011/0058088 A1 | 3/2011 | Hsu et al. |
| 2011/0058091 A1* | 3/2011 | Hsu ...................... A61B 5/1172 348/340 |
| 2011/0096219 A1* | 4/2011 | Lee .................. H01L 27/14618 348/308 |
| 2014/0140587 A1 | 5/2014 | Ballard et al. |
| 2016/0049526 A1* | 2/2016 | Oganesian ........ H01L 31/02002 257/434 |
| 2016/0218136 A1* | 7/2016 | Lee .................. H01L 27/14636 |
| 2017/0180619 A1* | 6/2017 | Ba-Tis ................. H04N 5/2253 |

FOREIGN PATENT DOCUMENTS

| | | |
|---|---|---|
| EP | 2280415 A2 | 2/2011 |
| WO | 2006/101274 A1 | 9/2006 |
| WO | 2008/026169 A1 | 3/2008 |

\* cited by examiner

OPTICAL MODULE, FABRICATION METHOD THEREOF, AND TERMINAL DEVICE USING THE SAME

CROSS-REFERENCE TO RELATED APPLICATIONS

This application is a continuation of International Application No. PCT/CN2017/118638 filed on Dec. 26, 2017, which claims the priority of Chinese Patent Application No. 201721489594.2 filed on Nov. 9, 2017, the disclosures of which are hereby incorporated by reference in their entirety.

TECHNICAL FIELD

Embodiments of the present application relate to the technical field of optical devices, and in particular, relate to an optical module, a fabrication method thereof, and a terminal device using the same.

BACKGROUND

With the development of communication technologies, mobile terminals are being extensively applied in people's daily life and work. At present, the mobile terminals are all equipped with a fingerprint identification apparatus, which performs various operations such as unlocking based fingerprint identification, and password setting and the like. In the fingerprint identification apparatuses, capacitive fingerprint apparatuses and optical fingerprint identification apparatuses are two types of commonly used fingerprint identification apparatuses.

However, the conventional capacitive fingerprint identification apparatus has a limited penetration capability, a complicated ID structure, a great module thickness, a limited placement position, and thus are unfavorable to lightening and thinning and miniaturization of the mobile terminals. The current optical fingerprint identification apparatus has a strong penetration capability and supports random placement below the screen. However, in one aspect, when the optical fingerprint identification apparatus is arranged below the screen of a terminal, the optical fingerprint identification apparatus needs to be superimposed over the battery of the mobile terminal, and many parts or components in the packaging structure of the optical fingerprint identification apparatus are superimposed; and in another aspect, based on the requirement on identification precision, the higher the precision, the thicker the apparatus, which is also unfavorable to lightening and thinning and miniaturization of the mobile terminal.

SUMMARY

In view of the above, embodiments of the present application provide an optical module, a fabrication method thereof, and a terminal using the same, to solve the problem that the optical module in the related art has a greater thickness which is unfavorable to lightening and thinning and miniaturization of a mobile terminal.

According to a first aspect of embodiments of the present application, an optical module is provided. The optical module includes a lens and a sensor package. The lens is positioned at an uppermost position of the optical module and attached to a lower position of a terminal screen, and is configured to transmit light passing through the screen; the sensor package includes an optical sensor, where a photosensitive region is arranged on an upper surface of the optical sensor, and the photosensitive region is configured to receive light passing through the lens; and the sensor package further includes an air gap, and the photosensitive region of the optical sensor is configured to receive the light passing through the screen via the air gap.

According to a second aspect of embodiments of the present application, another optical module is provided. The optical module includes a lens and a sensor package. The lens is positioned at an uppermost position of the optical module and attached to a lower position of a terminal screen, and is configured to transmit light passing through the screen; the sensor package includes an optical sensor, where a photosensitive region is arranged on an upper surface of the optical sensor, and the photosensitive region is configured to receive light passing through the lens; and an air gap is defined between the lens and the sensor package, and the photosensitive region of the optical sensor is configured to receive the light passing through the screen via the air gap.

According to a third aspect of embodiments of the present application, an optical module fabrication method is provided. The method includes: packaging an optical sensor to form a sensor package having an air gap, where a photosensitive region configured to receive light is arranged on an upper surface of the optical sensor, and the air gap in the sensor package is positioned above the photosensitive region of the optical sensor; and forming an optical module by using the sensor package and a lens configured to transmit light, where the lens is positioned at an uppermost position of the optical module.

According to a fourth aspect of embodiments of the present application, another optical module fabrication method is provided. The method includes: packaging an optical sensor to form a sensor package, where a photosensitive region configured to receive light is arranged on an upper surface of the optical sensor; defining an air gap below a lens configured to transmit light; and forming an optical module using the sensor package and the lens having the air gap, where the lens is positioned at an uppermost position of the optical module, and the photosensitive region of the optical sensor is configured to receive light via the air gap.

According to a fifth aspect of embodiments of the present application, a terminal device is provided. The terminal device includes the above described optical module.

As seen from the above technical solutions, in the optical module according to embodiments of the present application, the air gap is arranged in the sensor package in which the optical sensor is packaged, and the optical sensor receives light passing through the screen via the air gap, and thus practices imaging. The air gap may be filled with a corresponding gaseous medium. The gaseous medium has a low refractive index, and thus may effectively reducing interference to the light for imaging reaching the optical sensor. In this way, accuracy of fingerprint detection and identification is ensured. As compared with imaging based on light passing through other media and reaching the optical sensor in a conventional optical module achieving the same degree of accuracy, with the same thickness, the accuracy of detection and identification is higher. From another perspective, the same accuracy is achieved with a smaller thickness, such that a balancing effect is achieved between accuracy and thickness of the optical module, and the optical module becomes thinner while the accuracy of detection and identification is maintained.

BRIEF DESCRIPTION OF THE DRAWINGS

For clearer description of the technical solutions according to the embodiments of the present application or in the related art, drawings that are to be referred for description of the embodiments or the prior art are briefly described hereinafter. Apparently, the drawings described hereinafter merely illustrate some embodiments of the present application. Persons of ordinary skill in the art may also derive other drawings based on the drawings described herein without any creative effort.

REFERENCE NUMERALS AND DENOTATIONS THEREOF

10—lens; 11—parallel light channel; 21—optical sensor; 211—photosensitive region; 212—metal pad; 22—air gap; 23—substrate; 231—discrete device; 232—tin ball; 233—pad; 24—plastic packaging adhesive; 25—lid; 26—carrier; 27—interposer; 30—filter layer; 60—screen; 81—first die attach film; 82—second die attach film; 83—third die attach film; 84—fourth die attach film; 90—bond wire; 91—wire; 92—bump; and 93—redistribution layer.

DETAILED DESCRIPTION

For the sake of making the objectives, technical features, and advantages of the present application more apparent and more understandable, the technical solutions according to the embodiments of the present invention are further described in detail with reference to the accompany drawings. Apparently, the embodiments described herein are merely some exemplary ones, rather than all the embodiments of the present application. Based on the embodiments of the present application, all other embodiments derived by persons of ordinary skill in the art without any creative efforts shall fall within the protection scope of the present application.

Specific implementations of the embodiments of the present application are further described hereinafter with reference to the accompanying drawings of the present application.

First Embodiment

Figure 1:
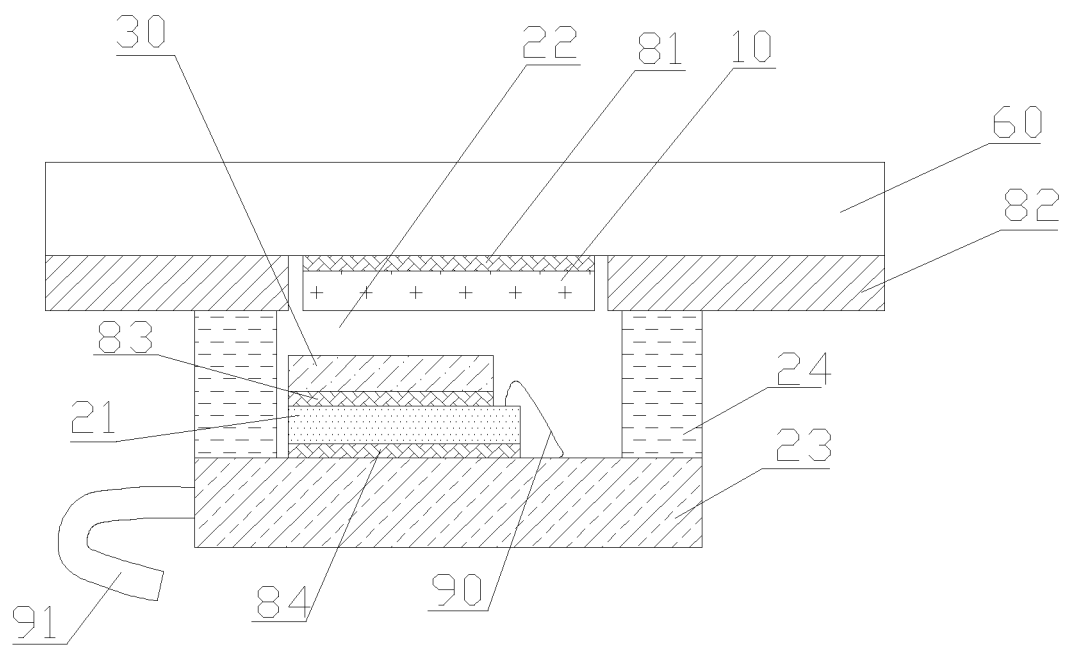
FIG. 1 is a schematic structural view of an optical module according to a first embodiment of the present application.

As illustrated in FIG. 1, according to this embodiment of the present application, an optical module includes a lens 10 and a sensor package. The lens 10 is positioned at an uppermost position of the optical module and attached to a lower position of a terminal screen 60, and is configured to transmit light passing through the screen 60; the sensor package includes an optical sensor 21, where a photosensitive region 211 is arranged on an upper surface of the optical sensor 21, and the photosensitive region 211 is configured to receive light passing through the lens 10; and the sensor package further includes an air gap 22, and the photosensitive region 211 of the optical sensor 21 is configured to receive the light passing through the screen 60 via the air gap 22.

The optical sensor 21 in the optical module is configured to receive light for use in imaging, and hence generate an image based on the light. The air gap 22 is arranged in the sensor package including the optical sensor; and the optical sensor is configured to receive light passing through the screen via the air gap, and hence achieve imaging. The air gap 22 may be filled with a corresponding gaseous medium. The gaseous medium has a low refractive index, and thus may effectively reducing interference to the light for imaging reaching the optical sensor. In this way, accuracy of fingerprint detection and identification is ensured. As compared with imaging based on light passing through other media and reaching the optical sensor in a conventional optical module achieving the same degree of accuracy, with the same thickness, the accuracy of detection and identification is higher. From another perspective, the same accuracy is achieved with a smaller thickness, such that a balancing effect is achieved between accuracy and thickness of the optical module, and the optical module becomes thinner while the accuracy of detection and identification is maintained.

Relative to an optical module formed by bonding a filter layer and a lens using an adhesive in the related art, under the circumstance of the same identification accuracy, the optical module having the air gap 22 according to this embodiment has an even smaller thickness. In addition, by arranging the air gap 22 between the lens 10 and the optical sensor 21, an object distance between the optical sensor 21 and a subject under detection may be increased. As compared with the optical module in which the optical sensor 21 is directly attached to the lens 10 in the related art, the optical module according to this embodiment may reduce moire in the detection process, and improve the identification accuracy.

Optionally, in this embodiment, the air gap 22 may be an air interlayer, or may be replaced by a transparent superimposed substance; and in the packaging process, the air gap 22 may be practiced by a suitable packaging process, as long as the air gap 22 is defined between the lens 10 and the optical sensor 21. The air gap 22 may have a thickness in the range of 200 to 500 μm, which may improve fingerprint identification performance.

Optionally, the sensor package includes a substrate 23. According to different actual needs, the substrate 23 may be arranged at different positions of the sensor package.

For example, in one specific implementation, as illustrated in FIG. 1, the substrate 23 is arranged at a lowermost position of the sensor package, and the optical sensor 21 is positioned on an upper surface of the substrate 23.

In another specific implementation, the substrate 23 may be positioned above the optical sensor 21.

The substrate 23 is configured to mount and bear other structures of the sensor package. For example, the substrate 23 is configured to mount the optical sensor 21, and practice electrical connection between the optical sensor 21 and the substrate 23, such that a signal of the optical sensor 23 is output outside the sensor package via the substrate 23.

In this embodiment, the substrate 23 may be practiced by a combination of a rigid board and a flexible board. In the combination of the rigid board and the flexible board, the surface mount technology (SMT) and reinforced flexible printed circuit (FPC) achieve an even smaller thickness, and thus the thickness of the substrate 23 may be further reduced. In this way, the entire thickness of the optical module is reduced, and requirements on miniaturization, lightening and thinning are accommodated while the accuracy of detection and identification is maintained. The substrate 23 employing the combination of the rigid board and the flexible board may have an entire thickness less than or equal to 1 mm. A circuit configured to transmit the signal of the optical sensor 21 may be embedded on the substrate 23.

Figure 2:
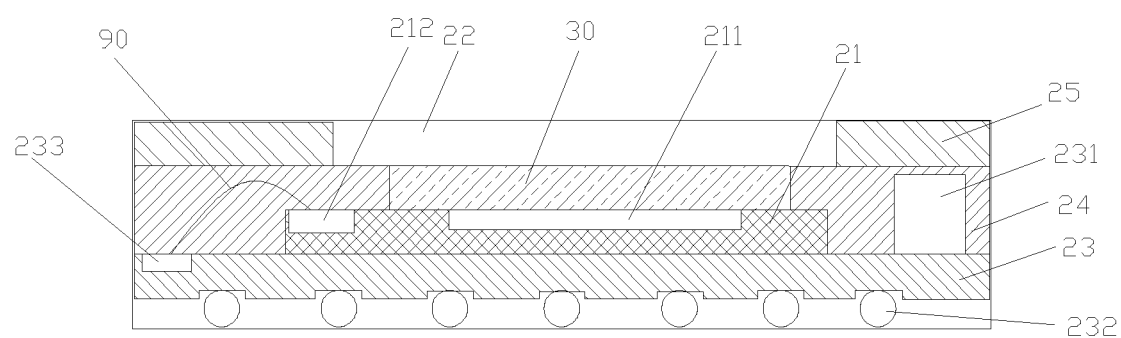
FIG. 2 is a schematic structural view of an optical module in a second packaging fashion according to a third embodiment of the present application.

Referring to FIG. 2, optionally, the substrate 23 may be provided with a discrete device 231 or may be provided with no discrete device 231. The discrete device 231 includes, for example, a resistor for protecting circuit, or a capacitor for storing energy, or the like. Nevertheless, the discrete device 231 may be arranged according to the actual needs. The substrate 23 may be connected to other structures via a connection wire 91 (as illustrated in FIG. 1) or the like, and thus practice transfer of signals, power and the like. The substrate 23 may also connected to other external structures of the sensor package via a pad or a tin ball 232 or the like, and thus practice transfer of signals, power and the like.

In this embodiment, the optical sensor 21 may be a complementary metal oxide semiconductor (CMOS) sensor. The CMOS sensor includes a photosensitive region 211 for photosensitive imaging. The optical sensor 21 may be integrated with a logic circuit and an optical sensor, and have a function of converting a received optical signal to an electrical signal. By packaging and fabrication, the optical sensor 21 may lead an electrical signal on the sensor to the exterior of the package, for ease of connection to an external device.

As illustrated in FIG. 1, using the scenario where the optical sensor 21 is positioned on the upper surface of the substrate 23 as an example, the optical sensor 21 may be bonded to the upper surface of the substrate 23 via a fourth die attach film 84. The fourth die attach film 84 below the optical sensor 21 may have a thickness greater than or equal to 1 μm, and thus may absorb light having a specific wavelength. According to different product requirements, a wavelength range may be determined, and thus a material of the fourth die attach film accommodating the requirements may be selected.

In this embodiment, the optical sensor 21 may be connected to the substrate 23 in a wirebond fashion. Specifically, a metal pad 212 of the optical sensor 21 may be connected to a pad 233 on the substrate 23. This connection may involve physical connection or may involve connections of both signals and power. The wirebond fashion achieves a better performance relative to a chip scale package (CSP) fashion, and in this fashion, spherical image interference may not easily occur. In other embodiments, the optical sensor 21 may also be electrically connected to the substrate 23 by bump mounting.

In one specific implementation, the optical sensor 21 is connected to the substrate 23 by a bond wire 90 of the optical module. The bond wire 90 is configured to transfer an electrical signal from the optical sensor 21 to the substrate 23, and a protective die attach film coated outside is arranged on the exterior of the bond wire 90. The protective adhesive layer coating the bond wire 90 may have such characteristics of low shrinkage rate, water-proofing and the like, and thus may better protect the bond wire 90 from environmental impacts. However, the function of the protective adhesive layer is not limited to such protection.

The bond wire 90 may be a gold wire and/or a copper wire. A specific material of the bond wire 90 may be determined according to the actual needs, cost and the like factors. For example, when a plurality of bond wires 90 are needed, some may be gold wires and some may be copper wires; or all the bond wires 90 may be fabricated from the same material, both the gold wires or the copper wires or the like, which is not specifically defined herein.

Optionally, the sensor package further includes a plastic packaging adhesive 24 configured to package and protect the optical sensor 21 and the like structures.

As illustrated in FIG. 1, in one specific implementation, the plastic packaging adhesive 24 defines a support structure surrounding outside the optical sensor 21, the plastic packaging adhesive 24 is arranged on the upper surface of the substrate 23, and an upper surface of the plastic packaging adhesive 24 is above the upper surface of the optical sensor 21, such that the air gap 22 is defined between the plastic packaging adhesive 24 and the optical sensor 21.

For example, an opening at least exposing from the photosensitive region 211 is defined at a portion of the plastic packaging adhesive 24 that is above the optical sensor 21, such that the air gap 22 is defined between the plastic packaging adhesive 24 and the optical sensor 23. Still for example, a top of the plastic packaging adhesive 24 is connected to the screen 60 via a second die attach film 82, such that the air gap 22 is defined above the optical sensor 21.

In this embodiment, the plastic packaging adhesive 24 is a light shielding material. For example, the plastic packaging adhesive 24 may be in a dark color to achieve the effect of shielding light. However, the plastic packaging adhesive 24 may also be other materials that are capable of absorbing light having a specific wavelength, which is not limited herein.

In this embodiment, the support structure formed by the plastic packaging adhesive 24 may have a thickness that may be adjusted according to the actual needs, as long as the air gap 22 is defined and has a height accommodating the requirement.

Optionally, the thickness of the air gap 22 is greater than or equal to 10 μm. In the meantime, since the air gap may be flexibly adjusted based on the thickness of the support structure, as compared with the fabrication processes of the optical module such as a mold process (injection molding and the like fabrication processes), the fashion of forming the support structure by the plastic packaging adhesive 24 makes a more flexible adjustment of the thickness of the optical module and a lower practice cost.

Optionally, the lens 10 is bonded to a lower position of the screen 60 via a first die attach film 81, the lens 10 corresponds to the optical sensor 21, and the air gap 22 is positioned below the lens 10 and above the optical sensor 21.

In this embodiment, the screen 60 may be an organic light-emitting diode (OLED) material, but is not limited to such material.

In addition, the screen 60 may have a foam/black adhesive layer on a rear side thereof. For example, the foam or black adhesive layer is attached on a side of the screen 60 proximal to a metal cathode or on the metal cathode, to prevent light leakage in some occasions, and a region corresponding to the lens 10 on the screen 60 is a light transmission region for light to pass through.

The second die attach film 82 is further configured to bond the plastic packaging adhesive 24 to the screen 60. For example, the plastic packaging adhesive 24 may be bonded to a structure such as the foam or black adhesive layer or the like equipped on the screen via the second die attach film 82. The second die attach film 82 may be a material having the effect of absorbing light having a specific wavelength to prevent ambient light from passing through the second die attach film 82 to cause light leakage. In this way, light leakage is prevented and impacts on the identification accuracy of the optical sensor 21 are eliminated.

The lens 10 may absorb light having a specific wavelength, such that the lens achieves a filtering effect. However, the lens 10 is not limited to such effect. The lens 10 may also be provided with an optical modulation opening or channel. The optical modulation opening has an effect similar to a pinhole in pinhole imaging. The channel allows the light to pass through to form a collimated light, and obliquely incident light may collide with a wall of the channel when passing through the lens 10 and thus may be absorbed, such that the light passing through the lens 10 is a direct light.

The first die attach film 81 for bonding the lens 10 may be fabricated by a material that is capable of transmitting light having a specific wavelength, such that the light transmission is ensured while the lens 10 is bonded. In this way, detection and identification of the optical module may not be affected.

The lens 10 is a light path modulation device, and practices transmission of special light by modulating a light path. The lens 10 is configured to improve the fingerprint identification performance, and may be arranged below the screen 60 or above the optical sensor 21. In addition, the lens 10 may be integrated in the package by packaging, or may be added during subsequent assembling of the module. The lens 10 needs to cover the photosensitive region of the optical sensor 21. When the optical module includes a filter layer 30, the lens 10 may be arranged above the filter layer 30 or arranged below the filter layer 30. Optionally, the first die attach film 81 has a thickness less than or equal to 200 µm.

As illustrated in FIG. 2, in another specific implementation, the sensor package further includes a lid 25. The lid 25 is positioned on the upper surface of the plastic packaging adhesive 24, and the air gap 22 is defined between the lid 25 and the optical sensor 21.

The lid 25 is a lid provided with an opening, and the opening on the lid 25 corresponds to the photosensitive region 211 of the optical sensor 21, such that the air gap is defined between the lid 25 and the optical sensor 21.

In still another specific implementation, the substrate 23 is provided with an opening, the optical sensor 21 is positioned in the opening on the substrate 23, the upper surface of the substrate 23 is above the upper surface of the optical sensor 21, and the air gap 22 is defined between the substrate 23 and the optical sensor 21.

Figure 8:
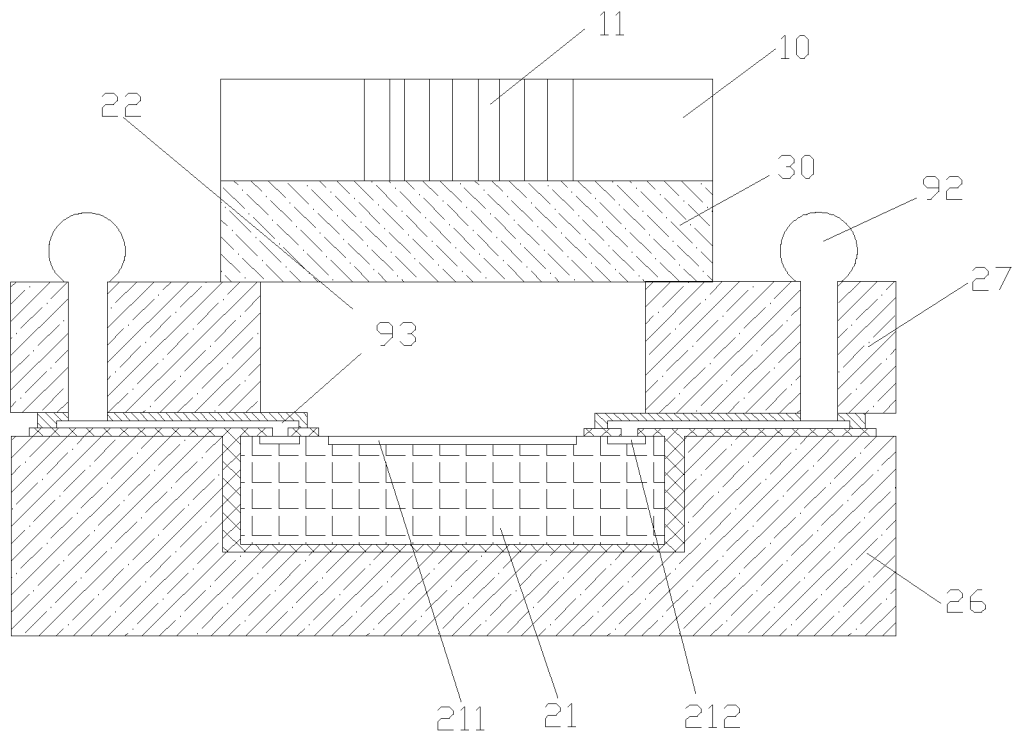
FIG. 8 is a schematic structural view of an optical module in a seventh packaging fashion according to the third embodiment of the present application.
Figure 9:
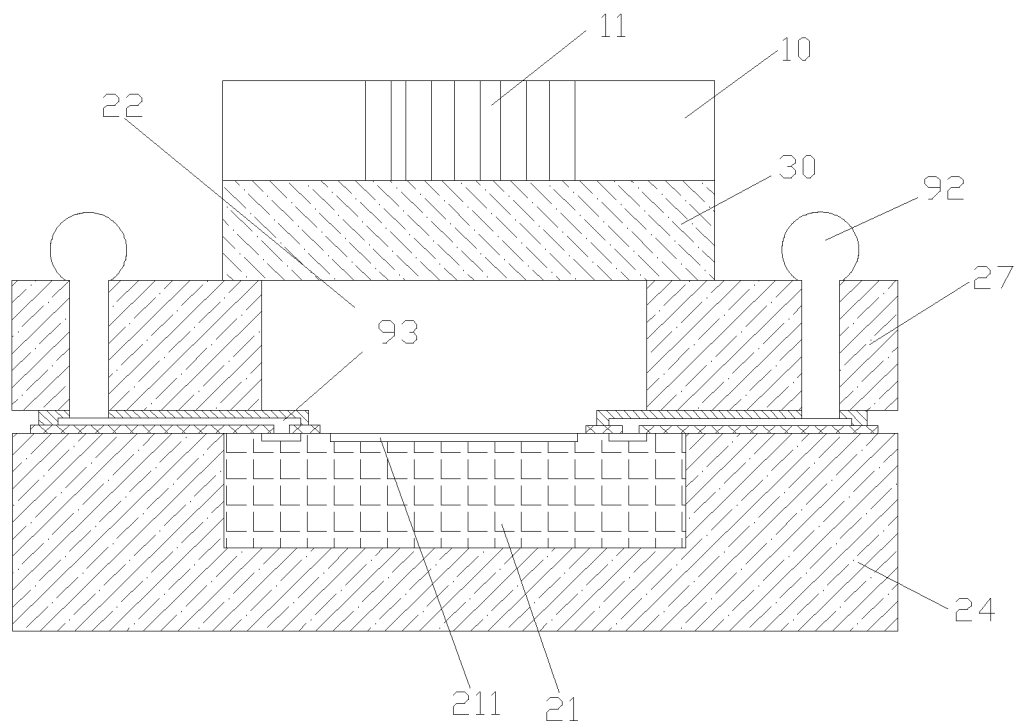
FIG. 9 is a schematic structural view of an optical module in an eighth packaging fashion according to the third embodiment of the present application.
Figure 10:
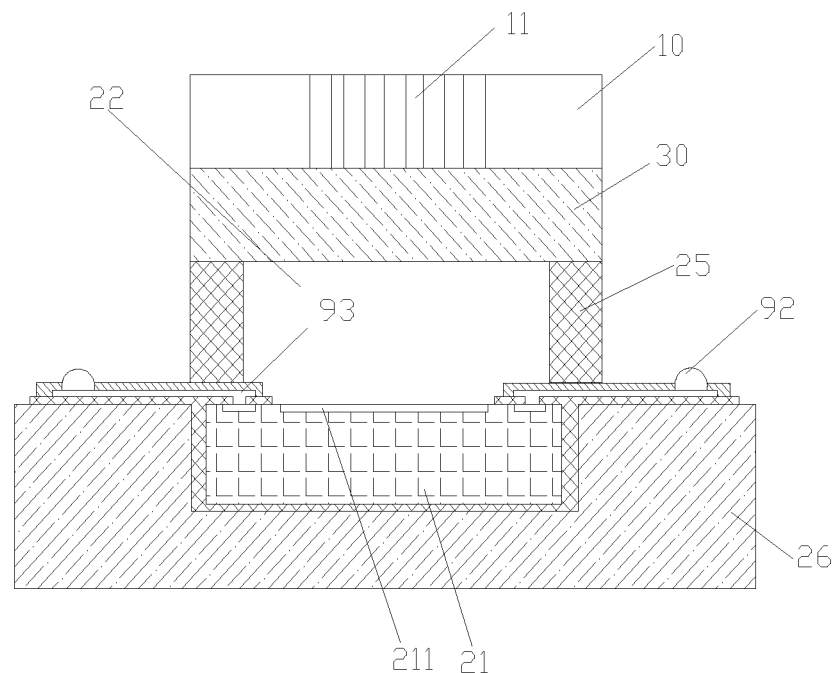
FIG. 10 is a schematic structural view of an optical module in a ninth packaging fashion according to the third embodiment of the present application.

The above describes the optical module according to the embodiment of the present application using the scenario where the substrate 23 is used as a bearer as an example. However, in another feasible implementation, the substrate 23 may be replaced by a carrier 26. As illustrated in FIG. 8 to FIG. 10, the sensor package further includes the carrier 26, where the carrier 26 is positioned at a lowermost position of the sensor package. A side surface of the carrier 26 coats the optical sensor 21, which increases an area of the package besides the optical sensor 21, and achieves effects of expanding a fan-out redistribution region and protecting the chip. The carrier 26 may be a silicon sheet, a plastic packaging material or a substrate. A groove for receiving the optical sensor 21 may be formed by a trenching process, or the optical sensor 21 may be coated by an open mold process.

A structure having effects of bearing and protecting the optical sensor 21 similar to the carrier 26 may be formed by coating the optical sensor 21 with the plastic packaging adhesive 24. The carrier 26 may also be fabricated from other materials by other fabrication processes. Using fabrication of the carrier 26 using the plastic packaging adhesive 24 as an example, the optical sensor 21 is positioned on the upper surface of the plastic packaging adhesive 24, and an upper surface of the carrier 26 (that is, the plastic packaging adhesive 24) is flush with the upper surface of the optical sensor 21.

Using fabrication of the carrier 26 using other materials as an example, the carrier 26 is provided with an opening, the optical sensor 21 is positioned in the opening on the carrier 26, and an upper surface of the carrier 26 is flush with the upper surface of the optical sensor 21.

An interposer 27 or a lid 25 is arranged over the plastic packaging adhesive 24 or the carrier 26, where the air gap 22 is defined between the interposer 27 or the lid 25 and the optical sensor 21.

The interposer 27 or the lid 25 is a structure having an opening, and the air gap 22 may be defined between the opening of the interposer 27 or the lid 25 and the optical sensor 21.

Optionally, the optical module further includes a filter layer 30, where the filter layer 30 is positioned between the lens 10 and the optical sensor 21.

In this embodiment, the filter layer 30 may be a filter sheet. The filter sheet has an effect of absorbing light having a specific wavelength, and may filter light according to the actual needs. The filter sheet is equivalent to a bandpass filter sheet. The filter layer 30 may at least filter a portion of the light, such that undesired light is prevented from causing interference and impacts on the detection and identification of the optical sensor 21. For example, during fingerprint identification, if a user places his or her finger randomly, a portion of ambient light may be transmitted to the optical module. If the ambient light, together with light reflected by the finger, reaches the optical sensor 21 at the same time, identification by the optical sensor 21 may be inaccurate or may fail. In this case, the undesired light generated by the ambient light needs to be removed, such that accuracy of the identification is not affected.

In one specific implementation, a lower part of the filter layer 30 is bonded to the optical sensor 21 via a third die attach film 83 (as illustrated in FIG. 1) which is capable of transmitting light having a wavelength in a specific range. The specific range may be specifically determined according to different product requirements. If the filter layer 30 is a filter sheet, at least one surface of the filter sheet may be provided with a reflective plating layer which may reflect light having some wavelengths, such that the undesired light is prevented from passing through. The light to be filtered herein is light which adversely affects the accuracy of identification. Upper and lower surfaces of the filter sheet may be both provided with a reflective plating layer, or either of the upper and lower surfaces of the filter sheet may be provided with a reflective plating layer, or neither of the upper and lower surfaces of the filter sheet is provided with a reflective plating layer.

In this embodiment, the filter layer 30 covers the photosensitive region 211 of the optical sensor 21, and is arranged under the lens 10. An area of the filter layer 30 is greater than or equal to the area of the photosensitive region 211 of the optical sensor 21, and the area of the lens is greater than or equal to the area of the filter layer 30. In this way, it may be ensured that the light reaching the filter layer 30 is processed by the lens 10 (for example, focusing processing). The area of the filter layer 30 is greater than or equal to the area of the photosensitive region 211 of the optical sensor 21, and the filter layer 30 covers the photosensitive region 211 of the optical sensor 21, such that the light reaching the photosensitive region 211 of the optical sensor 21 is processed by the filter layer 30 to ensure the accuracy of detection and identification of the optical module.

The filter layer 30 may employ a transparent or semitransparent material as a base material, and achieve an effect of cutting of light in a specific waveband by coating on the surface of the filter layer 30. The filter layer 30 is arranged above the optical sensor 21. Alternatively, the filter layer 30 may employ the optical sensor 21 as a base material, and achieve an effect of filtering light by directly coating on the surface of optical sensor 21. The filter layer 30 maintains optical signal transfer with the optical sensor 21, and may be integrated in the package by packaging or may be added during subsequent assembling of the module. The filter layer 30 may be arranged below the screen 60 and above the optical sensor 21. The filter layer 30 may be integrated in the package by packaging, or may be arranged externally independently and added during assembling of the module. In addition, the filter layer 30 may not be arranged according to the actual needs. The filter layer 30 is sized to cover the photosensitive region 211 of the optical sensor 21.

The lens 10 may be attached to the filter layer 30 via a transparent die attach film (DAF), or frame attached to the filter layer 30 via an adhesive film, or arranged externally directly and added during assembling of the module. The filter layer 30 may be arranged above the air gap 22 by attachment via the transparent DAF or by frame attachment via the adhesive film, or arranged externally and added during assembling of the module.

It should be noted that when the optical module includes the filter layer 30, during electrically connecting the optical sensor 21 to the substrate 23 via the bond wire 90, as illustrated in FIG. 1, a radian height of the bond wire 90 is less than a sum of the thicknesses of the optical sensor 21 and the filter layer 30. That is, a highest point at a bending part of the bond wire 90 does not exceed a top surface of the filter layer 30.

As illustrated in FIG. 1, a total thickness of the entire structure of the optical module is greater than 0.8 mm, and may not exceed 1.1 mm. A value range of the thickness of the substrate 23 is 50 to 500 µm, preferably, 400 µm. The thickness of the support structure formed by the plastic packaging adhesive 24 is determined based on the height of the air gap 22, for example, 500 µm. A value range of the thickness of the second die attach film 80 is 10 µm to 1 mm, preferably, 200 µm. A value range of the thickness of the lens 10 is 50 to 400 µm, preferably 150 µm. A value range of the thickness of the first die attach film 81 between the lens 10 and the screen 60 is 0 to 100 µm, preferably, 50 µm, where the smaller the thickness, the better. A value range of the thickness of the air gap 22 is greater than 10 µm, preferably, 250 µm, where in an ideal state, the greater the thickness, the better. A value range of the thickness of the filter layer 30 is 50 to 400 µm, preferably 110 µm. A value range of the thickness of the optical sensor 21 is 25 to 650 µm, preferably 100 µm. A value range of the thickness of the third die attach film 83 between the optical sensor 21 and the filter layer 30 is greater than 10 µm, preferably, 20 µm. A value range of the thickness of the fourth die attach film 84 between the optical sensor 21 and the substrate 23 is greater than 10 µm, preferably, 20 µm.

The above dimensions are merely exemplary, and the specific dimensions may be specifically determined based on the process requirements.

Second Embodiment

In this embodiment, an optical module is provided. Different from the optical module in the first embodiment, in the optical module according to this embodiment, the air gap is positioned outside the sensor package.

Based on this, the optical module according to this embodiment includes a lens 10 and a sensor package. The lens 10 is positioned at an uppermost position of the optical module and attached to a lower position of a terminal screen 60, and is configured to transmit light passing through the screen 60; the sensor package includes an optical sensor 21, where a photosensitive region 211 is arranged on an upper surface of the optical sensor 21, and the photosensitive region 211 is configured to receive light passing through the lens 10; and an air gap 22 is defined between the lens 10 and the sensor package, and the photosensitive region 211 of the optical sensor 21 is configured to receive the light passing through the screen 60 via the air gap 22.

In this embodiment, the optical module includes the air gap 22, where the air gap 22 may be filled with a corresponding gaseous medium. The gaseous medium has a low refractive index, and thus may effectively reducing interference to the light for imaging reaching the optical sensor. In this way, accuracy of fingerprint detection and identification is ensured. As compared with imaging based on light passing through other media and reaching the optical sensor in a conventional optical module achieving the same degree of accuracy, with the same thickness, the accuracy of detection and identification is higher. From another perspective, the same accuracy is achieved with a smaller thickness, such that a balancing effect is achieved between accuracy and thickness of the optical module, and the optical module becomes thinner while the accuracy of detection and identification is maintained.

In this embodiment, the sensor package may further include a substrate 23, a filter layer 30, a plastic packaging adhesive 24 and the like in addition to the optical sensor 21. The optical sensor 21 is arranged on an upper surface of the substrate 23, and a metal pad 212 of the optical sensor 21 is connected to a pad on the substrate 23 via a bond wire 90. The filter layer is arranged on an upper surface of the optical sensor 21, and at least covers the photosensitive region 211. The plastic packaging adhesive 24 packages the substrate 23, the filter layer 30 and the optical sensor 21, and an upper surface of the plastic packaging adhesive 24 is flush with an upper surface of the filter layer 30.

The functions of the substrate 23, the filter layer 30 and the plastic packaging adhesive 24 in this embodiment are the same as the functions of the substrate 23, the filter layer 30 and the plastic packaging adhesive 24 in the first embodiment, which are thus not described herein any further.

Figure 12:
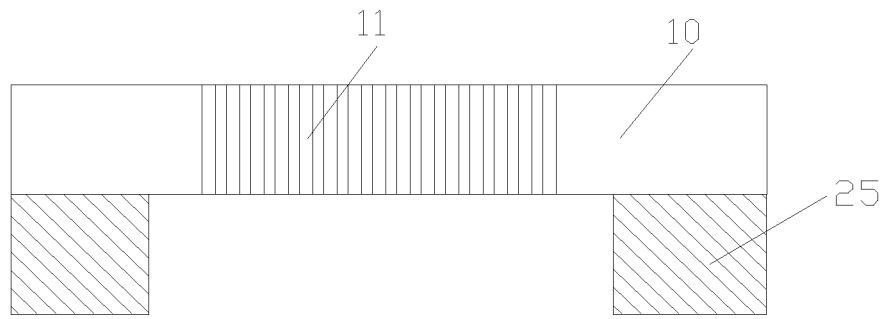
FIG. 12 is a schematic structural view of a first irregular lens of the optical module by the optical module fabrication method according to the fourth embodiment of the present application.

Optionally, as illustrated in FIG. 12, the optical module further includes a lid 25, where the lid 25 is positioned between the lens and the sensor package, and the lid 25 is a lid provided with an opening, and the air gap 22 is defined between the lens 10 and the sensor package via the opening on the lid 25. Nevertheless, in other embodiments, the lid 25 may be other structures, as long as the air gap 22 is defined between the lens and the sensor package.

Nevertheless, a groove may be directly machined on the lens 10, such that the air gap 22 is defined between the lens 10 and the sensor package via the groove on the lens 10.

Third Embodiment

In this embodiment, an optical module fabrication method is provided. The method is applied to fabrication of the optical module according to the first embodiment or the second embodiment.

The optical module fabrication method according to this embodiment includes: packaging an optical sensor 21 to form a sensor package having an air gap 22, where a photosensitive region 211 configured to receive light is arranged on an upper surface of the optical sensor 21, and the air gap 22 in the sensor package is positioned above the photosensitive region 211 of the optical sensor 21; and forming an optical module by using the sensor package and a lens 10 configured to transmit light, where the lens 10 is positioned at an uppermost position of the optical module.

The optical module fabricated by using the optical module fabrication method has a high degree of packaging integration. Since the optical module includes an air gap 22 which may be filled with a gaseous medium having low refractive index, for example, air, interference to the light for imaging that reaches the optical sensor may be effectively reduced, accuracy of fingerprint detection and identification is ensured, and meanwhile an entire thickness of the optical module may be reduced. In addition, integrated packaging of the optical sensor 21 and the air gap 22 improves the degree of package integration, reduces a total thickness of the optical module and enhances fingerprint image quality.

Figure 14:
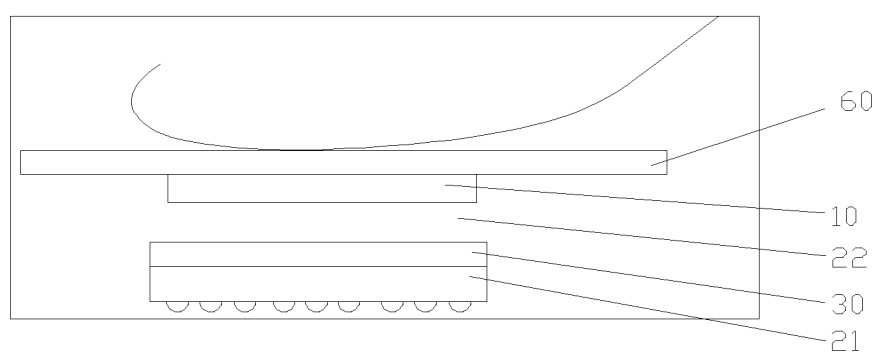
FIG. 14 is a schematic view of fingerprint identification using the optical module according to first embodiment of the present application.

A structure by which the optical module fabricated by using the optical module fabrication method according to this embodiment is applied to a mobile terminal is as illustrated in FIG. 14. The optical module may be applied to a full display mobile terminal. The optical module for fingerprint identification is mounted below a screen 60. Light emitted by the screen 60 is irradiated to a fingerprint on the surface of a finger and then reflected to a surface of the lens 10, subjected to light path modulation (focusing) by the lens 10 and passed through the air gap 22 (the light may be passed through the filter layer 30 according to the actual needs), and finally imaged on the surface of the optical sensor 21. Finally, the optical sensor 21 captures an optical signal and converts the optical signal into an electrical signal, and thus acquires the fingerprint.

In practice, the above optical module may be fabricated by using any one of the packaging fashions hereinafter.

First Packaging Fashion

Before the optical sensor 21 is packaged to form the sensor package having the air gap 22, the optical sensor 21 is firstly connected to a substrate 23.

For example, the optical sensor 21 may be bonded to the substrate 23, and the optical sensor 21 is electrically connected to the substrate 23.

Figure 3:
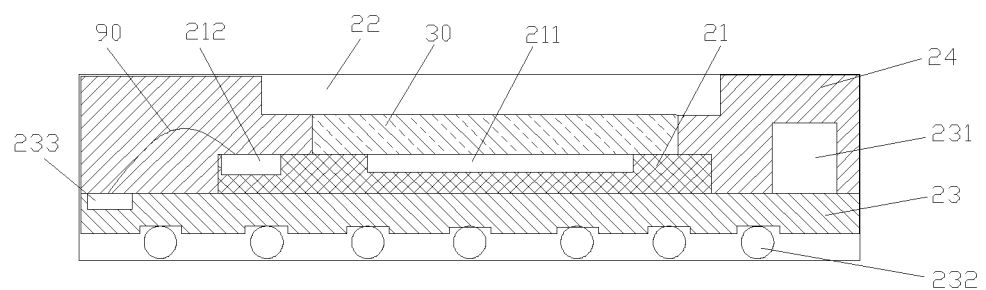
FIG. 3 is a schematic structural view of an optical module in a first packaging fashion according to the third embodiment of the present application.

In a specific implementation, the optical sensor 21 (which may be a singulated sensor chip) is bonded to an upper surface of the substrate 23 via an epoxy resin or a die attach film (DAF), and the photosensitive region of the optical sensor 21 is made to face upward. The optical sensor 21 is electrically connected to the substrate 23 via a bond wire 90. A fabricated optical module is as illustrated in FIG. 2 and FIG. 3.

Optionally, the optical sensor 21 may be packaged by a first packaging process, and a sensor package having the air gap 22 is formed, such that the optical sensor 21 is packaged and the sensor package having the air gap 22 is formed.

In a specific implementation, a filter layer 30 may be arranged on the optical sensor 21 according to the actual needs. If the filter layer 30 is arranged, the method further includes: attaching the filter layer 30 on the upper surface of the optical sensor 21 via a transparent adhesive or a transparent DAF, such that the filter layer 30 at least covers the photosensitive region 211 of the optical sensor 21. In this way, the optical sensor 21 is positioned between the filter layer 30 and the substrate 23.

The first packaging process may be an irregular open mold process (a molding process which may present a predefined shape for a plastic packaging adhesive upon the molding). The optical sensor 21, the filter layer 30 and the substrate 23 are packaged using a plastic packaging adhesive 24, and the air gap 22 is defined between the plastic packaging adhesive 24 and the optical sensor 21. During plastic packaging by the irregular open mold process, an upper surface of the filter layer 30 is made to expose outside, such that the air gap 22 is defined. A tin ball 232 may be mounted on a pad on a lower surface of the substrate 23 (whether to mount a tin ball may be determined according to the actual needs, or the pad may be directly reserved), and the package is cut. A sensor package upon the packaging is as illustrated in FIG. 3.

The lens 10 is bonded to an upper surface of a singulated sensor package upon the cutting to form an optical module, and the lens 10 is positioned at an uppermost position of the optical module.

Second Packaging Fashion

In this packaging fashion, the packaging process is similar to that in the packaging fashion 1. Therefore, the identical packaging process is not described herein any further. Instead, only the different packaging process is described hereinafter.

In this packaging fashion, the first packaging process may be an open mold process (a molding process which may cause a surface of a chip upon the molding to expose outside). The optical sensor 21, the filter layer 30 and the substrate 23 are packaged using the plastic packaging adhesive 24, the upper surface of the filter layer 30 is flush with the upper surface of the plastic packaging adhesive 24, and the plastic packaging adhesive 24 is exposed outside. A lid 25 is bonded to the upper surface of the plastic packaging adhesive 24, such that the air gap 22 is defined between the lid 25 and the optical sensor 21, and the sensor package is formed. The lid 25 arranged on the upper surface of the plastic packaging adhesive 24 is a lid having a through hole, and the air gap 22 is defined at the through hole on the lid 25. The tin ball 232 may be mounted on the pad on the lower surface of the substrate 23, and finally the package is cut. A sensor package upon the packaging is as illustrated in FIG. 2.

The lens 10 is bonded to an upper surface of a singulated sensor package upon the cutting to form an optical module, and the lens 10 is positioned at an uppermost position of the optical module.

Packaging Fashion 3

Figure 4:
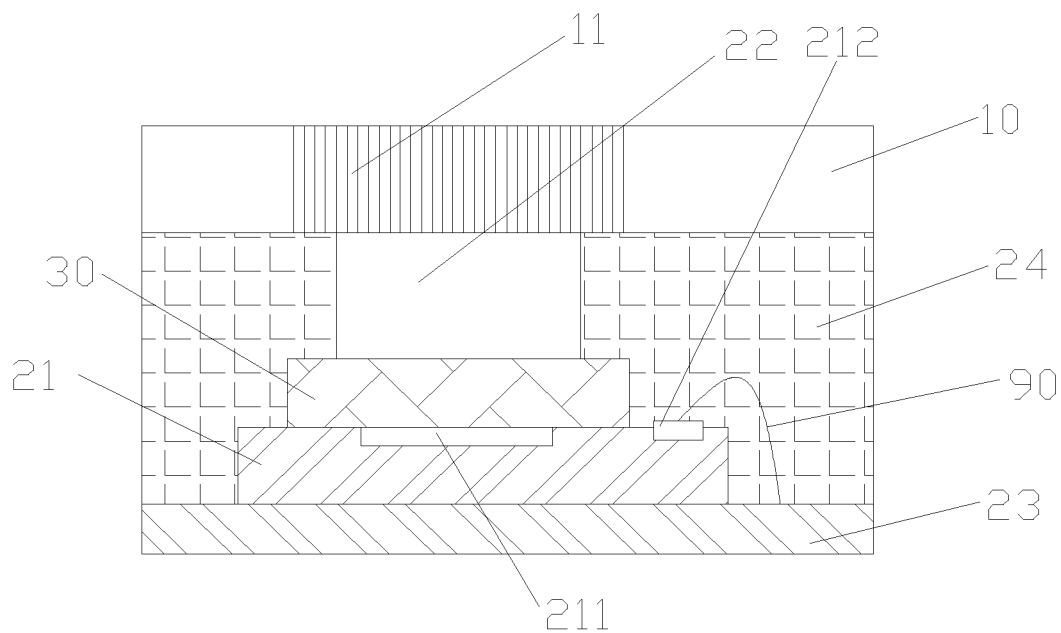
FIG. 4 is a schematic structural view of an optical module in a third packaging fashion according to the third embodiment of the present application.

In this packaging fashion, the packaging process in which the optical sensor 21 is mainly packaged to form the sensor package having the air gap 22 is mainly described. The process of connecting the optical sensor 21 to the substrate 23 may be the same as that in the first packaging fashion, which is thus not described herein any further. The packaging process includes: packaging the optical sensor 21 by the first packaging process, and forming the sensor package having the air gap 22. An optical module upon the packaging is as illustrated in FIG. 4.

Specifically,

A filler layer is arranged on the upper surface of the filter layer 30. The filler layer has a thickness that may be determined based on a height of the air gap to be defined, for example, 200 to 500 µm. The filler layer may be fabricated from an photosensitive material, for ease of peeling.

The filter layer 30 having the filler layer is bonded to the upper surface of the optical sensor 21, such that the filter layer 30 at least covers the photosensitive region 211 of the optical sensor 21, and the optical sensor 21 is positioned between the filter layer 30 and the substrate 23. The optical sensor 21 and the filter layer 30 may be bonded to each other via a transparent DAF or the like.

The first packaging process is an open mold process. By the first packaging process, the optical sensor 21, the filler layer, the filter layer 30 and the substrate 30 are packaged using the plastic packaging adhesive 24. The filler layer is peeled, such that the air gap 22 is defined the plastic packaging adhesive 24 and the optical sensor 21, and the sensor package is formed. Specifically, the filler layer may be peeled using a peeling agent which dissolves the filler layer and only maintains the air gap 22. Finally, cutting is performed to cut the package into singulated packages.

On the resulted sensor package, the lens 10 with a parallel optical channel 11 being etched on a lens base is combined to the sensor package via, for example, frame attachment.

Fourth Packaging Fashion

Figure 5:
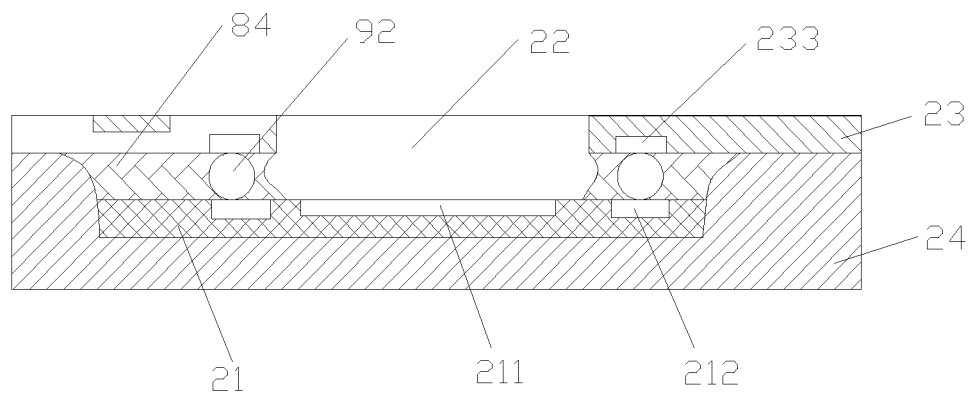
FIG. 5 is a schematic structural view of an optical module in a fourth packaging fashion according to the third embodiment of the present application.

As illustrated in FIG. 5, in this packaging fashion, in the optical module fabrication method, the process of bonding the optical sensor 21 to the substrate 23, and electrically connecting the optical sensor 21 connected to the substrate 23 includes:

providing a through hole on the substrate 23; mounting a bump on a wafer of an optical sensor chip by a bump process (also referred to as a ball mounting process), and forming the optical sensor 21 by dicing; and connecting the optical sensor 21 to the substrate 23 by a flip chip process, and electrically connecting the optical sensor 21 to the substrate 23 via the bump. In this case, a metal pad 121 of the optical sensor 21 is electrically connected to a pad 233 on the substrate 23 via the bump.

In the optical module fabrication method, the process of packaging the optical sensor 21 by the first packaging process, and forming the optical package having the air gap 22 includes:

using a mold process (an injection molding process which packages a chip and a package carrier together using a molding mould, and then injects a plastic packaging adhesive to the mould to achieve plastic packaging) as the first packaging process); sealing the optical sensor 21 by underfill dispensing, for example, forming a fourth die attach film 84 by underfill dispensing, sealing the optical sensor 21 and the substrate 23 via the fourth die attach film 84, and at least exposing the formed fourth die attach film 84 out of the photosensitive region of the optical sensor 21; packaging the optical sensor 21 and the substrate 23 by the first packaging process, defining the air gap 22 between the substrate 23 and the optical sensor 21, and forming the sensor package; and finally, cutting the package to form singulated sensor packages.

The lens 10 is bonded to the singulated sensor package to form an optical module, and the lens 10 is positioned at an uppermost position of the optical module.

Fifth Packaging Fashion

Figure 7:
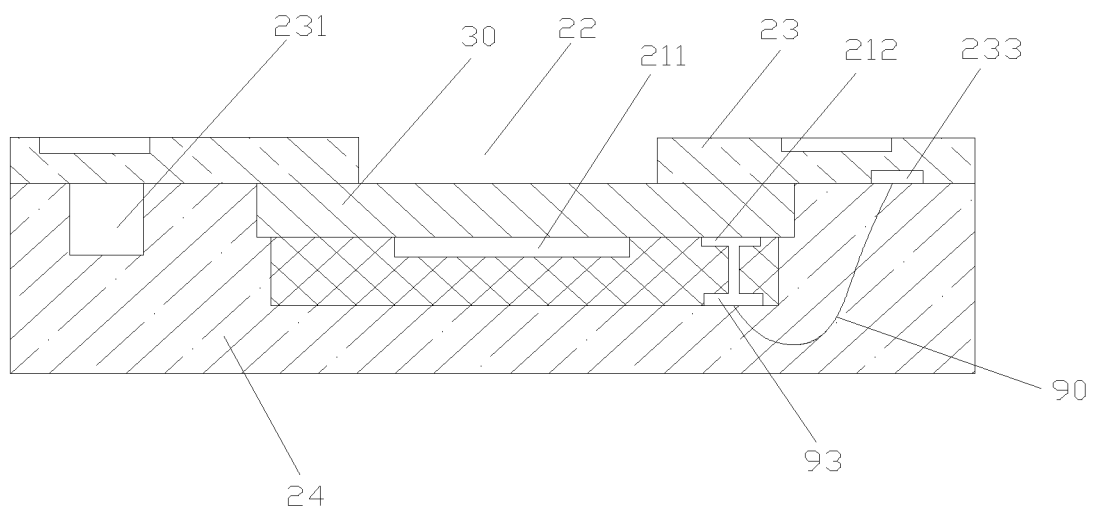
FIG. 7 is a schematic structural view of an optical module in a fifth packaging fashion according to the third embodiment of the present application.

As illustrated in FIG. 7, in the optical module fabrication method, the process of bonding the optical sensor 21 to the substrate 23, and electrically connecting the optical sensor 21 connected to the substrate 23 includes:

providing a through hole on the substrate 23. fabricating an optical sensor chip by a through silicon via (TSV) process, where the TSV process is carried out for a wafer for the optical sensor chip; electrically connecting a metal pad 212 on an upper surface of the optical sensor chip to a redistribution pad on a lower surface of the optical sensor chip via a TSV; and bonding the optical sensor chip to the substrate 23, and electrically connecting the optical sensor chip to the substrate 23 via a bond wire 90.

In a specific implementation, the filter layer 30 is bonded to the substrate 23. The optical sensor chip is bonded to the filter layer 30, and the filter layer 30 at least covers a photosensitive region 211 of the corresponding optical sensor chip. The redistribution pad of the optical sensor chip is electrically connected to the substrate 23 via the bond wire 90.

In the optical module fabrication method, the process of packaging the optical sensor 21 by the first packaging process, and forming the optical package having the air gap 22 includes:

using a mold process as the first packaging process; and packaging the optical sensor chip, the filter layer 30 and the substrate 23 using the plastic packaging adhesive 24 by the first packaging process, and forming the sensor package by singulated cutting, where sensor chips in various sensor packages are optical sensors 21, and the air gap 22 is defined between the substrate 23 and the optical sensor 21, for example, the air gap 22 is defined above the filter layer 30 at the through hole on the substrate 23 in FIG. 7.

The lens 10 is bonded to the sensor package formed upon the cutting to form an optical module, and the lens 10 is positioned at an uppermost position of the optical module.

Sixth Packaging Fashion

Figure 6:
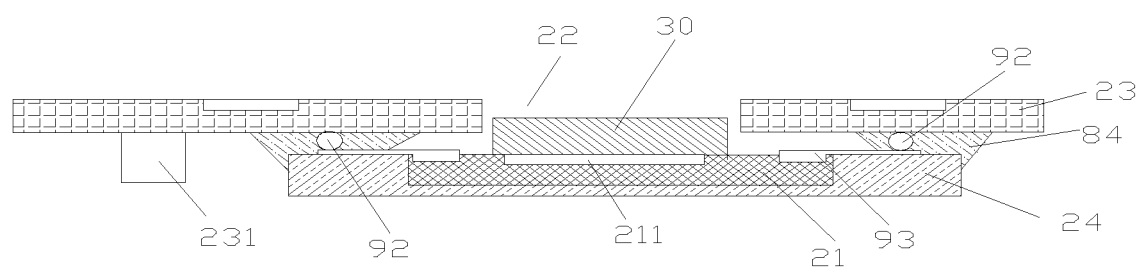
FIG. 6 is a schematic structural view of an optical module in a sixth packaging fashion according to the third embodiment of the present application.

As illustrated in FIG. 6, in the optical module fabrication method, before the optical sensor 21 is packaged to form the sensor package having the air gap 22, the optical module fabrication method further includes providing a through hole on the substrate 23.

In the optical module fabrication method, the process of packaging the optical sensor 21 to form the sensor package having the air gap 22 includes: packaging the optical sensor chip by a fan-out process (by the fan-out process, an electrical signal may be led out to the exterior of the chip region), and forming a redistribution pad, where the redistribution pad is electrically connected to a metal pad on the optical sensor chip; mounting a bump 92 on the redistribution pad; electrically connecting the optical sensor chip to the substrate 23 by an SMT process; forming the fourth die attach film 84 by underfill dispensing, sealing the optical sensor chip via the fourth die attach film 84, and exposing the photosensitive region 211 of the optical sensor chip from the through hole on the substrate 23, where the filter layer 30 may be bonded to an upper surface of the photosensitive region 211 according to the filtering needs; and forming the sensor package by singulated cutting.

Sensor chips in various sensor packages are optical sensors 21, and the air gap 22 is defined between the substrate 23 and the optical sensor 21.

The lens 10 is bonded to the sensor package formed upon the cutting to form an optical module, and the lens 10 is positioned at an uppermost position of the optical module.

Seventh Packaging Fashion

As illustrated in FIG. 8, in this packaging process, in the optical module fabrication method, the forming the optical sensor 21 to form the sensor package having the air gap 22 includes:

thinning and dicing the wafer of the optical sensor chip, and forming a singulated optical sensor 21; and connecting the optical sensor 21 to a carrier 26, and causing an upper surface of the optical sensor 21 to be flush with an upper surface of the carrier 26.

As illustrated in FIG. 8, the carrier 26 may be a carrier fabricated from any suitable material. In a specific implementation, the optical sensor 21 may be connected to the carrier 26 via an opening provided on the carrier 26, and the optical sensor 21 is bonded to the opening, such that the upper surface of the optical sensor 21 is flush with an upper surface of the carrier 26. A first insulation layer may also be formed on the upper surface of the carrier 26 and an upper surface of the metal pad 212 of the optical sensor 21 to ensure insulation and prevent electrical leakage or short circuit or the like. A redistribution layer 93 electrically connected to the metal pad 212 of the optical sensor 21 is formed on the first insulation layer by the fan-out process. A second insulation layer is formed on the redistribution layer.

It should be noted that the redistribution layer, that is, RDL, leads out the electrical signal of the optical sensor chip by metal redistribution, and is arranged on the surface of the optical sensor chip and the surface of the carrier (that is, the carrier 26). The RDL leads out the electrical signal of the optical sensor 21 above a non-photosensitive region by the metal redistribution fabricated by the fan-out process, which may be arranged on an upper surface of the non-photosensitive region on the surface of the chip or may be arranged on the upper surface of the carrier. The optical sensor 21 leads the electrical signal to the upper surface of the carrier by the RDL, or leads the electrical signal to an upper surface of another structure by the RDL.

An interposer 27 having a through hole is bonded to the second insulation layer. A bump is mounted on the interposer 27, such that the bump 92 is electrically connected to the redistribution layer 93 (RDL wiring), the sensor package is formed, and the air gap 22 is defined between the interposer 27 and the optical sensor 21. For example, as illustrated in FIG. 8, the air gap 22 is defined at the through hole above the photosensitive region 211 of the optical sensor 21.

It should be noted that to ensure that the photosensitive region 211 is capable of receiving light and implementing the functionality thereof, the redistribution layer 93 needs to be arranged to avoid the photosensitive region, which may be expanded on an upper surface of the first insulation layer. The second insulation layer may achieve an effect of protecting the redistribution layer 93. The bump 92 may be interconnected to an external device, for example, a circuit board, to practice electrical connection.

The first insulation layer and the second insulation layer are used to practice insulation protection, and are arranged above and below the RDL. The first insulation layer and the second insulation layer may cover the photosensitive region 211 of the optical sensor 21, or may not cover the photosensitive region 211 of the optical sensor 21. The materials of the insulation layers may be only reserved in the non-photosensitive region of the optical sensor 21 in an exposure and development fashion, or may be transparent materials and reserved above the photosensitive region of the optical sensor 21.

The bump may practice electrical connection between the optical sensor 21 and an external device, and is arranged on the surface of the package. The bump is arranged above the non-photosensitive region, and is configured to be connected to the external device to practice the electrical connection to the optical sensor chip. Alternatively, the bump may not be arranged according to the actual needs, and the pad is reserved.

The interposer may be a silicon sheet, an organic substance or a substrate, which may practice transfer of the electrical signal from one side to the other side.

The hollow lid may be a plastic packaging adhesive or a metal sheet.

The air gap 22 may be replaced by a transparent superimposed layer (for example, glass), and the transparent superimposed layer is directly attached to an upper position of the optical sensor 21 or the filter layer 30.

After the sensor package is formed, the lens 10 and the filter layer 30 may be attached, via a transparent DAF or via frame attachment, to an upper position of an irregular fan-out package formed by the fan-out process to form the optical module. In the optical module, it needs to be ensured that the lens 10 and the filter layer 30 cover the entire photosensitive region 211.

Eighth Packaging Fashion

In this packaging process, the differences from the seventh packaging fashion lie in the material of the carrier 26 and the fashion of connection to the optical sensor 21. The other packing processes may be the same as those in the seventh packaging fashion, or only adaptively adjusted, which are thus not described herein any further.

As illustrated in FIG. 9, in a specific implementation, in the optical module fabrication method, the connecting the optical sensor 21 to the carrier 26, and causing the upper surface of the optical sensor 21 to be flush with the upper surface of the carrier 26 includes:

Packaging the optical sensor 21 using the plastic packaging adhesive 24 (for example, an EMC plastic packaging material) by the open mold process, and causing the plastic packaging adhesive 24 to form the carrier 26 below the optical sensor 21, such that the upper surface of the carrier 26 is flush with the upper surface of the optical sensor 21.

Ninth Packaging Fashion

As illustrated in FIG. 10, in this packaging process, the differences from the seventh packaging fashion mainly lie in the process of packaging the optical sensor 21 to form the sensor package having the air gap 22. The other processes are the same as or similar to those in the seventh packaging fashion, which are thus not described herein any further. The process of packaging the optical sensor 21 to form the sensor package having the air gap 22 includes:

bonding the lid 25 having the through hole to the second insulation layer; and providing an opening on the second insulating layer and mounting a bump in the opening, such that the bump is electrically connected to the redistribution layer, the sensor package is formed, and the air gap 22 is defined between the lid 25 and the optical sensor 21.

Fourth Embodiment

In this embodiment, an optical module fabrication method is provided. The method is applied to fabrication of the optical module according to the first embodiment or the second embodiment. In this embodiment, the optical module fabrication method is different from the optical module fabrication method according to the third embodiment in that the air gap 22 is defined on the lens 10, and the sensor package may be a common package.

The optical module fabrication method according to this embodiment includes: packaging an optical sensor 21 to form a sensor package, where a photosensitive region 211 configured to receive light is arranged on an upper surface of the optical sensor 21, and an air gap 22 is defined below a lens 10 configured to transmit light; and forming an optical module by using the sensor package and the lens 10 having the air gap 22, where the lens 10 is positioned at an uppermost position of the optical module, and a photosensitive region 211 of the optical sensor 21 is configured to receive light via the air gap 22.

In the optical module fabrication method, a degree of packaging integration of the optical module may be improved, a packaging thickness may be reduced, and the air gap 22 is additionally arranged. In addition, integrated packaging of the optical sensor 21 and the air gap 22 improves the degree of package integration, reduces a total thickness of the optical module and enhances fingerprint image quality. The air gap 22 of the optical module may be defined on the lens 10 whereas the sensor package employs an LGA packaging structure, such that packaging difficulties are lowered.

In a specific implementation, the defining the air gap 22 below the lens 10 configured to transmit light includes: bonding a lid 25 having a through hole to a lower position of the lens 10, and defining the air gap 22 at the through hole of the lid 25.

Specifically, for example, on a lens substrate, a parallel light channel 11 is machined by dry etching (or laser), and the lens 10 is generated. A layer of lid 25 having the through hole with a specific thickness (for example, 200 to 500 μm is attached to the lens 10 by sticking (or bonding). Cutting is performed to cut the irregular lens into singulated ones, and the irregular singulated lens is as illustrated in FIG. 12.

In a specific implementation, the defining the air gap 22 below the lens 10 configured to transmit light includes: machining a groove at a lower position of the lens 10, and defining the air gap 22 at the groove.

Figure 13:
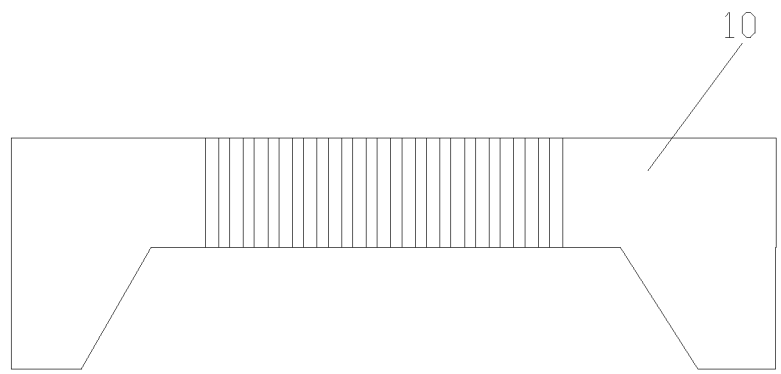
FIG. 13 is a schematic structural view of a second irregular lens of the optical module by the optical module fabrication method according to the fourth embodiment of the present application.

Specifically, for example, a groove is machined firstly on a lens substrate by dry etching (or wet etching or the like); then a parallel light channel 11 is machined on an upper surface of the groove; and finally, cutting is performed to cut the irregular lens into singulated ones, and the singulated irregular lens formed upon the cutting is as illustrated in FIG. 13.

The process of forming the sensor package includes: attaching a substrate 23, the optical sensor 21 and a filter layer 30, completing fabrication of the bond wire; electrically connecting a metal pad 212 of the optical sensor 21 to a substrate 23; then packaging by an open mold process such that a top surface of the filter layer 30 is exposed from a plastic packaging adhesive 24; and finally cutting the package into singulated ones.

Figure 11:
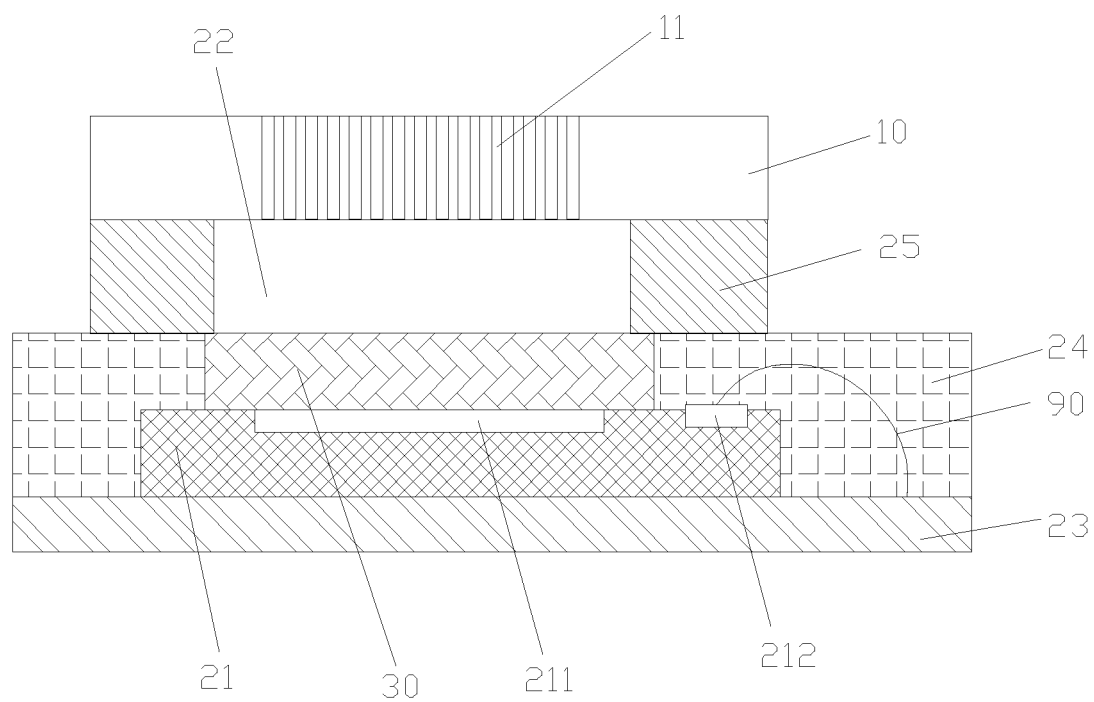
FIG. 11 is a schematic structural view of an optical module by an optical module fabrication method according to a fourth embodiment of the present application.

After fabrications of these two parts are both completed, the sensor package and the lens 10 are combined via a transparent DAF or via frame attachment, and thus the optical module as illustrated in FIG. 11 is practiced.

Fifth Embodiment

In this embodiment, a terminal device is provided. The terminal device includes the above described optical module. The terminal device employs the above described optical module, such that the volume of the terminal device is reduced, and the terminal device is lightened and thinned while performance of the terminal device is ensured.

In this way, the volume of the terminal device having the above described optical module is reduced, and lightening and thinning of the terminal device are achieved while the accuracy of identification is maintained.

The terminal device may be a mobile terminal device, for example, a mobile phone, a tablet computer, a video recorder, a camera or the like. Still, the terminal device may also be an attendance machine or the like.

Finally, it should be noted that the above embodiments are merely intended to describe the technical solutions of the embodiments of the present application, instead of limiting the present application. Although the present application is described in detail with reference to the above embodiments, persons of ordinary skill in the art should understand that various modifications may be made to the technical solutions described in the above embodiments or equivalent replacements may be made to some technical features thereof, without departing from the spirit and scope of the technical solutions of the embodiments of the present application.

What is claimed is:

1. An optical module, comprising a lens and a sensor package; wherein
    the lens is positioned at an uppermost position of the optical module and arranged under a lower position of a terminal screen, and is configured to transmit light passing through the terminal screen;
    the sensor package comprises an optical sensor, a photosensitive region being arranged on an upper surface of the optical sensor, the photosensitive region being configured to receive light passing through the lens; and
    an air gap is formed between the lens and the photosensitive region of the optical sensor, and the photosensitive region of the optical sensor is configured to receive the light passing through the terminal screen via the air gap,
    wherein the sensor package further comprises:
        a carrier provided with an opening in which the optical sensor is positioned, wherein an upper surface of the carrier is flush with the upper surface of the optical sensor;

a redistribution layer arranged on an upper surface of the optical sensor formed by a fan-out process, an interposer arranged above the carrier, wherein the air gap is formed between the interposer and the optical sensor, and a bump mounted on the interposer such that the bump is electrically connected to the redistribution layer.

2. An optical module fabrication method, comprising:

packaging an optical sensor to form a sensor package, wherein a photosensitive region configured to receive light is arranged on an upper surface of the optical sensor; and forming an optical module by using the sensor package and a lens configured to transmit light, wherein the lens is positioned at an uppermost position of the optical module, wherein an air gap is formed between the lens and the photosensitive region of the optical sensor, wherein the packaging an optical sensor to form a sensor package further comprises:

packaging the optical sensor by a fan-out process, and forming a redistribution pad;

mounting a bump on the redistribution pad;

electrically connecting the optical sensor to the substrate via the bump by a surface mounting technology (SMT) process;

sealing the optical sensor by underfill dispensing, and exposing a photosensitive region of the optical sensor from a through hole on a substrate of the optical sensor; and bonding a filter layer to an upper surface of the photosensitive region.

3. The method according to claim 2, wherein prior to the packaging an optical sensor to form a sensor package, the method further comprises:

bonding the optical sensor to the substrate, and electrically connecting the optical sensor to the substrate; and the packaging an optical sensor to form a sensor package comprises:

packaging the optical sensor by a first packaging process, and forming the sensor package.

4. The method according to claim 3, wherein the bonding the optical sensor to the substrate, and electrically connecting the optical sensor to the substrate comprises:

mounting a bump on a wafer of an optical sensor chip by a bump process, and forming the optical sensor by dicing; and connecting the optical sensor to the substrate by a flip chip process, and electrically connecting the optical sensor to the substrate via the bump.

5. The method according to claim 4, wherein the packaging the optical sensor by a first packaging process, and forming the sensor package comprises:

sealing the optical sensor by underfill dispensing; and packaging the optical sensor and the substrate by the first packaging process, defining the air gap between the substrate and the optical sensor, and forming the sensor package, wherein the first packaging process is a mold process.

6. The method according to claim 2, wherein the packaging an optical sensor to form a sensor package comprises:

forming the sensor package by singulated cutting, wherein sensor chips in various sensor packages are optical sensors, and the air gap is defined between the substrate and the optical sensor.

7. An optical module, comprising a lens and a sensor package, wherein:

the lens is positioned at an uppermost position of the optical module and arranged under a lower position of a terminal screen, and is configured to transmit light passing through the terminal screen;

the sensor package comprises an optical sensor, a photosensitive region being arranged on an upper surface of the optical sensor, the photosensitive region being configured to receive light passing through the lens; and an air gap is formed between the lens and the photosensitive region of the optical sensor, and the photosensitive region of the optical sensor is configured to receive the light passing through the terminal screen via the air gap, wherein the sensor package further comprises a carrier positioned at a lowermost position of the sensor package; wherein the sensor package further comprises a plastic packaging adhesive, the optical sensor is positioned on an upper surface of the carrier, and an upper surface of the plastic packaging adhesive is flush with the upper surface of the optical sensor;

an interposer or a lid is arranged above the plastic packaging adhesive, and the air gap is formed between the interposer or the lid and the optical sensor.

* * * * *